(12) United States Patent
Shah et al.

(10) Patent No.: US 7,004,375 B2
(45) Date of Patent: Feb. 28, 2006

(54) PRE-APPLIED FLUXING UNDERFILL COMPOSITION HAVING PRESSURE SENSITIVE ADHESIVE PROPERTIES

(75) Inventors: Jayesh Shah, Plaistow, NH (US); Brian Wheelock, Sandown, NH (US); Quinn K. Tong, Belle Mead, NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 87 days.

(21) Appl. No.: 10/444,604

(22) Filed: May 23, 2003

(65) Prior Publication Data

US 2004/0232210 A1 Nov. 25, 2004

(51) Int. Cl.
  B23K 31/02 (2006.01)
  C08K 9/10 (2006.01)

(52) U.S. Cl. .......... 228/215; 523/211; 525/107
(58) Field of Classification Search .......... 228/215; 523/211; 156/145, 244.12; 525/107
See application file for complete search history.

(56) References Cited

U.S. PATENT DOCUMENTS

| 6,169,022 | B1 | 1/2001 | Saitou |
| 6,171,887 | B1 | 1/2001 | Yamaji |
| 6,194,788 | B1 | 2/2001 | Gilleo et al. |
| 6,297,560 | B1 | 10/2001 | Capote et al. |
| 6,399,178 | B1 | 6/2002 | Chung |
| 6,400,033 | B1 | 6/2002 | Darveaux |
| 6,652,688 | B1 * | 11/2003 | Matsumura et al. .......... 156/64 |
| 6,713,867 | B1 | 3/2004 | Mannak et al. |
| 2002/0032280 | A1 | 3/2002 | Charles et al. |
| 2002/0162679 | A1 | 11/2002 | Hannan et al. |
| 2003/0034128 | A1 * | 2/2003 | Matsumura et al. ..... 156/330.9 |
| 2003/0166812 | A1 * | 9/2003 | Taniguchi et al. .......... 526/274 |
| 2004/0169275 | A1 | 9/2004 | Danvir et al. |
| 2004/0231152 | A1 * | 11/2004 | Morganelli et al. .......... 29/840 |
| 2004/0232210 | A1 * | 11/2004 | Shah et al. ............ 228/180.22 |
| 2004/0232530 | A1 * | 11/2004 | Morganelli et al. ......... 257/678 |
| 2004/0234689 | A1 * | 11/2004 | Morganelli et al. ......... 427/256 |
| 2004/0238925 | A1 * | 12/2004 | Morganelli et al. ......... 257/678 |
| 2004/0245611 | A1 * | 12/2004 | Morganelli et al. ......... 257/678 |

FOREIGN PATENT DOCUMENTS

| WO | WO 00/34032 | 6/2000 |
| WO | WO 02/24391 | 3/2002 |
| WO | WO 02/080261 | 10/2002 |
| WO | WO 02/093595 | 11/2002 |
| WO | WO 2004/071140 | 8/2004 |

* cited by examiner

Primary Examiner—Kiley S. Stoner
(74) Attorney, Agent, or Firm—Charles W. Almer

(57) ABSTRACT

The present invention relates to a pressure sensitive fluxing underfill composition that may be pre-applied to electronic components, such as CSP's, in order to increase the reliability of the component against mechanical stresses such as impact and bending. The composition contains an epoxy resin, a solid anhydride curing agent, and catalyst. Other materials, such as air release agents and fillers, may also be added as desired. The composition may be applied selectively to parts of the CSP, for example to the solder bumps. The composition provides sufficient tack in order to hold the electronic assembly together during the assembly process.

12 Claims, No Drawings

PRE-APPLIED FLUXING UNDERFILL COMPOSITION HAVING PRESSURE SENSITIVE ADHESIVE PROPERTIES

FIELD OF THE INVENTION

The present invention is related to a pre-applied fluxable underfill composition that is slightly tacky at room temperature and useful for electronic component assembly.

BACKGROUND OF THE INVENTION

This invention relates to pre-applied fluxable underfill compositions that are slightly tacky at room temperature to provide pressure sensitive adhesive properties during electronic component assembly. The compositions are used to protect and provide a connection between an electronic component and a substrate in a microelectronic device and to flux the interconnections between the two. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board. These chips are originally formed as a semiconductor wafer containing multiple chips. The semiconductor wafer is diced as desired into individual chips or chip packages.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent the failure, the gap between the component and the substrate is filled with a polymeric encapsulant, hereinafter called underfill or underfill encapsulant, to reinforce the interconnect material and to absorb some of the stress of the thermal cycling. Two prominent uses for underfill technology are for reinforcing packages, known in the industry as chip scale packages (CSP) and ball grid arrays (BGA), in which a chip package is attached to a substrate, and flip-chip packages in which a chip is attached by an array of interconnections to a substrate. Another function of the underfill is to reinforce the component against mechanical shock such as impact or vibration. This is especially important for durability in portable electronic devices such as cellular telephones and the like that may be expected to be accidentally dropped or otherwise stressed during use.

In conventional capillary flow underfill applications, the underfill dispensing and curing takes place after the reflow of the metallic or polymeric interconnect. In this procedure, flux is initially applied on the metal pads on the substrate. Next, the chip is placed on the fluxed area of the substrate, on top of the soldering site. The assembly is then heated to allow for reflow of the solder joint. At this point, a measured amount of underfill encapsulant material is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties. A drawback of capillary underfill is that its application requires several extra steps and is thus not economical for high volume manufacturing.

Recently, attempts have been made to streamline the process and increase efficiency by the use of no-flow underfill and dispensing the no-flow underfill directly on the assembly site before the placement of the component on that site. After the component is placed it is soldered to the metal connections on the substrate by passing the entire assembly through a reflow oven. During the process the underfill fluxes the solder and metal pads to facilitate their interconnection, and then polymerizes (cures) later in the process to function as a conventional underfill reinforcement. Thus the need for a separate flux or solder paste is eliminated. One limitation of the no-flow underfill process is that the substrate and components must be pre-dried to avoid excessive voiding within the underfill that will lead to solder extrusion that ultimately may create a short-circuit to another connection. Thus, the substrates must be dried before assembly and then stored in dry storage. This process is unwieldy for high volume manufacturers.

Another form of underfill that may be utilized is pre-applied underfill in the form of a film or a paste. It would be desirable to provide a pre-applied fluxing underfill that may be utilized with or without an additional underfill encapsulant. Such an underfill would preferably have pressure sensitive adhesive properties to provide tack for initial adhesion during assembly of the electronic device. The pre-applied underfill is applied to the interconnect members of the component and facilitates placement and fluxing of the component.

SUMMARY OF THE INVENTION

The present invention relates to a fluxing underfill composition that acts as a pressure sensitive adhesive upon application and that may be pre-applied to electronic components, such as CSP's, in order to increase the reliability of the component against mechanical stresses such as impact and bending. The composition contains an epoxy resin, an anhydride curing agent, and catalyst. Other materials, such as air release agents and fillers, may also be added as desired. The composition may be applied selectively to parts of the CSP such as the solder bumps. The pressure sensitive adhesive property of the composition provides sufficient tack in order to hold the electronic assembly together during the assembly process. As with no-flow underfill, the composition of the present invention also fluxes the solder to metal pad connections, thus eliminating the need for a separate processing aid such as solder paste or flux.

DETAILED DESCRIPTION OF THE INVENTION

The resins used in the pre-applied fluxable underfill encapsulant composition of the present invention may be curable compounds, which means that they are capable of polymerization. As used in this specification, to cure will mean to polymerize, with cross-linking. Cross-linking, as understood in the art, is the attachment of two-polymer chains by bridges of an element, a molecular group, or a compound, and in general takes place upon heating.

The pre-applied underfill composition of the invention may be utilized on electronic components such as area array devices, including CSP's and BGA's. The pre-applied underfill may comprise a pressure sensitive hot melt adhesive of other suitable material. The pre-applied underfill composition preferably comprises one or more epoxy resins, an anhydride curing agent, and a catalyst. Additional ingredients, such as air release agents, flow additives, adhesion promoters, rheology modifiers, surfactants and other ingredients may be included. The ingredients are specifically chosen to obtain the desired balance of properties for the use of the particular resins. For example, the anhydride component provides the composition with fluxing capability. The pre-applied fluxable underfill composition initially provides the properties of a pressure sensitive adhesive at room temperature and may be used either with or without another underfill composition, including but not limited to other underfill compositions containing expandable fillers. The underfill composition is a solid under ambient conditions, and melts to a low viscosity liquid at slightly elevated temperatures. Upon cooling it solidifies once again to a slightly tacky solid that adheres to various materials under pressure. At highly elevated temperatures, the composition melts and then polymerizes to a non-tacky solid. The underfill may be applied either to the tips of the connectors, such as solder bumps, or located between the substrate and the component or as a film.

Examples of epoxy resins suitable for use in the present underfill composition include monofunctional and multifunctional glycidyl ethers of Bisphenol-A and Bisphenol-F, and cycloaliphatic epoxy resins or a combination thereof. The cycloaliphatic epoxides are preferably selected from non-glycidyl ether epoxides containing more than one 1.2 epoxy group per molecule.

Glycidyl ether epoxides are preferred in the invention, either separately or in combination with the non-glycidyl ether epoxides. A preferred epoxy resin of this type is bisphenol A or bisphenol F epoxy resin. These resins are generally prepared by the reaction of one mole of bisphenol F or bisphenol A resin and two moles of epichlorohydrin. A further preferred type of epoxy resin is epoxy novolac resin. Epoxy novolac resin is commonly prepared by the reaction of phenolic resin and epichlorohydrin. A preferred epoxy novolac resin is poly(phenyl glycidyl ether)-co-formaldehyde. Biphenyl type epoxy resin may also be utilized in the present invention. This type of resin is commonly prepared by the reaction of biphenyl resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. Commercially available bisphenol-F type resin is available from CVC Specialty Chemicals, Maple Shade, N.J., under the designation 8230E and Resolution Performance Products LLC under the designation RSL1739. Bisphenol-A type epoxy resin is commercially available from Resolution Technology as EPON 828, and a blend of bisphenol-A and bisphenol-F is available from Nippon Chemical Company under the designation ZX-1059.

Examples of anhydride curing agents suitable for use in the invention are cycloaliphatic anhydrides, aromatic anhydrides, polyanhydrides, and mixtures thereof. Solid anhydrides that can be milled to a fine powder are preferred. The most preferred anhydride is polysebacic polyanhydride, available from Lonza Chemical. Other preferred anhydride curing agents are polyazelaic polyanhydride and polyadipic polyan hydride. Other an hydrides that may be utilized include hexahydro phthalic anhydride, tetrahydro phthalic anhydride, phthalic anhydride, bisphenyl dianhydride, benzophenone tetracarboxylic dianhydride, and mixtures thereof. In addition to the resins and anhydride curing agent, an imidazole, imidazole salt, or other suitable catalyst to effect polymerization during the reflow process is included in the pre-applied underfill composition. Additional ingredients may be added to the composition to produce a composition with the desired properties. For example, monofunctional reactive diluents can incrementally delay the increase in viscosity without adversely affecting the physical properties of the cured underfill. Preferred diluents include p-tert-butyl-phenyl glycidyl ether, allyl glycidyl ether, glycerol diglycidyl ether, glycidyl ether of alkyl phenol (commercially available from Cardolite Corporation as Cardolite NC513), and Butanedioldiglycidylether (commercially available as BDGE from Aldrich), although other diluents may be utilized. Surfactants may be utilized to aid in the prevention of process voiding during the component bonding process and subsequent solder joint reflow and material curing. Various surfactants which may be utilized include organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof. In addition, coupling agents, air release agents, flow additives, adhesion promoters and other ingredients may also be added as desired.

A preferred embodiment of the composition of the present invention comprises at least one epoxy resin, an anhydride curing agent, an imidazole-based catalyst, and other ingredients as desired. The composition will comprise in the range of about 30 wt % to about 98 wt % of the epoxy resin and preferably in the range of about 50 wt % to about 90 wt %. The composition will also comprise in the range of about 2 wt % to about 70 wt % of an anhydride curing agent and preferably in the range of about 30 wt % to about 50 wt percent of the composition. An imidazole, imidazole salt, or other suitable catalyst is also added. The catalyst comprises in the range about 0.01 wt % to about 10 wt % of the underfill composition and preferably about 0.1 wt % to about 5 wt % of the composition. Finally, optional ingredients such as surfactants, air release agents, flow additives, rheology modifiers, and adhesion promoters may be added to the composition in the range of about 0.01 wt % to about 5 wt % of the composition.

The pressure sensitive pre-applied underfill composition preferably has a slightly tacky consistency at room temperature. This consistency provides initial adhesion during use with a solder-bumped component. In use, the pre-applied underfill is coated on a flat surface at a desired thickness, preferably about 10 to about 70% of the solder bump height of the CSP. The coating is held at a slightly higher temperature than its melt temperature. The component solder bump array is dipped into the coating and then pressed onto a non-stick surface at room temperature in order to flatten the surface of the underfill. A coating of the pre-applied underfill is formed on the tips of the solder bumps during this dipping process. As the material on the tips of the solder bumps cools down to room temperature, it solidifies to a slightly tacky consistency. At this time the CSP is removed from the release liner and is in condition for placement on the desired substrate site without the application of any additional flux or solder paste. In an alternative embodiment, the underfill material may be dispensed in a pre-measured quantity through a heated syringe. In this embodiment, the CSP is preferably pre-heated so as to allow the underfill to self-level itself on the CSP. The pre-applied underfill is very stable at room temperature and, in the absence of a solvent, does not shrink after pre-application. The pre-applied fluxing underfill provides sufficient tack to hold the CSP in place on the substrate on its own. Upon exposure to heat during a standard eutectic reflow process, the pre-applied fluxing underfill melts to a low viscosity and provides the desired fluxing to the solder and metal pads to facilitate solder wetting and subsequent solder joint connection. Upon cooling, the pre-applied fluxing underfill cures to a low modulus thermosetting compound which provides reinforcement to the solder joint for protection against mechanical and thermal shock.

Alternatively, the pre-applied fluxable underfill may be applied as a film at the bottom of the CSP, at an intermediate thickness relative to the height of the solder bump. To apply the composition in this manner, the underfill is applied to a release liner at a temperature in the range of about 60–85C and a thickness in the range of about 10 to about 70% of the solder bump height. As the material cools, the CSP is placed on the coating with light pressure to ensure that the solder bumps penetrate into the composition. The solder bumps may be coated either only at their tips or along all or a portion of their sides. The liner is then removed and the material is transferred over to the CSP. Via this process, more underfill material is added to the CSP than is added via the dipping process. The additional material may result in higher reinforcement and better performance. Another advantage of applying the underfill to a partial fraction of the height of the solder bump is that this provides space for volatile compounds to escape from beneath the CSP during the reflow process.

The pre-applied underfill composition may also be utilized in a non-pressure sensitive format. In the case where the composition is not pressure sensitive, the substrate or CSP must be heated to create the tack necessary to attach the CSP to the substrate.

The invention may be better understood by reference to the following example formulation:

EXAMPLE

A formulation of the pressure sensitive pre-applied fluxing underfill was made having the ingredients listed in Table 1.

TABLE 1

Pressure sensitive pre-applied fluxing underfill

| Ingredient | Wt % |
|---|---|
| CVC8230E* | 54.02 |
| Polysebacic polyanhydride | 45.73 |
| 2-phenylimidazole phosphate | 0.25 |

*Bisphenol-F Epoxy

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A pressure sensitive fluxable underfill encapsulant material comprising
    a) at least one epoxy resin;
    b) a solid anhydride curing agent, and
    c) at least one catalyst,
wherein the catalyst is an imidazole-anhydride adduct comprising an adduct of imidazole and anhydride selected from the group comprising pyromellitic dianhydride, methylhexahydro phthalic anhydride. hexa-hydro phthalic anhydride, tetra-hydro phthalic anhydride, phthalic anhydride, bisphenyl dianhydride, benzophenone tetracarboxylic dianhydride, 1-cyanoethyl-2-ethyl-4-methyl-imidazole, alkyl-substituted imidazole, triphenylphosphine, onium borate, non-N-substituted imidazoles, 2-phenyl-4-methyl imidazole, 2-phenyl imidazole, imidazole, N-substituted imidazole and mixtures thereof and wherein the imidazole-anhydride adduct comprises in the range of about 0.01 wt % to about 10 wt % of the encapsulant.

2. The underfill encapsulant of claim 1, wherein the underfill encapsulant is a tacky solid at room temperature.

3. The underfill encapsulant of claim 1, wherein the at least one epoxy resin is selected from the group comprising monofunctional and multifunctional glycidyl ethers of Bisphenol-A, monofunctional and multifunctional glycidyl ethers of Bisphenol-F, aliphatic epoxies, aromatic epoxies, saturated epoxies, unsaturated epoxies, and cycloaliphatic epoxy resins.

4. The underfill encapsulant of claim 3, wherein at least one epoxy resin is selected from the group consisting of 3,4-epoxycyclohexylmethyl-3,4-epoxycyclohexane carboxylate, vinylcyclohexene dioxide, 3,4-epoxy-6-methyl cyclohexyl methyl-3,4-epoxycyclohexane carboxylate, dicyclopentadiene dioxide, epoxy novolac resin, poly (phenyl glycidyl ether)-co-formaldehyde, biphenyl type epoxy resin, dicyclopentadiene-phenol epoxy resins, naphthalene epoxy resins, epoxy functional butadiene acrylonitrile copolymers, epoxy functional polydimethyl siloxane, and mixtures thereof.

5. The underfill encapsulant of claim 1, wherein the at least one epoxy resin comprises in the range of about 30 wt % to about 98 wt % of the encapsulant.

6. The underfill encapsulant of claim 5, wherein the epoxy resin comprises in the range of about 40 wt % to about 60 wt % of the encapsulant.

7. The underfill encapsulant of claim 1, wherein the imidazole-anhydride adduct comprises an adduct of 2-phenyl-4-methyl imidazole and pyromelittic dianhydride.

8. The underfill encapsulant of claim 1, wherein the imidazole or imidazole-anhydride adduct comprises in the range of about 0.1 wt % to about 5 wt % of the encapsulant.

9. The underfill encapsulant of claim 1, wherein the catalyst is 2-phenylimidazole phosphate.

10. The underfill encapsulant of claim 9, wherein the 2-phenylimidazole phosphate comprises in the range of about 0.01 wt % to about 10 wt % of the encapsulant.

11. The underfill encapsulant of claim 10, wherein the 2-phenylimidazole phosphate comprises in the range of about 0.1 wt % to about 5 wt % of the encapsulant.

12. The underfill encapsulant of claim 1, wherein the encapsulant further comprises one or more of group consisting of surfactants, coupling agents, reactive diluents, air release agents, flow additives, adhesion promoters and mixtures thereof.

* * * * *